(12) United States Patent
Chen et al.

(10) Patent No.: US 10,573,609 B2
(45) Date of Patent: Feb. 25, 2020

(54) FAN-OUT ANTENNA PACKAGING STRUCTURE AND PREPARATION THEREOF

(71) Applicant: SJ Semiconductor(Jiangyin) Corporation, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 16/195,706

(22) Filed: Nov. 19, 2018

(65) Prior Publication Data

US 2019/0172802 A1    Jun. 6, 2019

(51) Int. Cl.
| | |
|---|---|
| *H01L 23/66* | (2006.01) |
| *H01L 21/48* | (2006.01) |
| *H01L 23/00* | (2006.01) |
| *H01L 21/56* | (2006.01) |
| *H01L 23/538* | (2006.01) |
| *H01L 23/367* | (2006.01) |
| *H01L 23/31* | (2006.01) |

(Continued)

(52) U.S. Cl.
CPC ............ *H01L 23/66* (2013.01); *H01L 21/486* (2013.01); *H01L 21/4853* (2013.01); *H01L 21/4857* (2013.01); *H01L 21/4871* (2013.01); *H01L 21/4889* (2013.01); *H01L 21/56* (2013.01); *H01L 21/6835* (2013.01); *H01L 23/3121* (2013.01); *H01L 23/3672* (2013.01); *H01L 23/5383* (2013.01); *H01L 23/5386* (2013.01); *H01L 24/16* (2013.01); *H01L 24/81* (2013.01); *H01Q 1/02* (2013.01); *H01Q 1/2283* (2013.01); *H01L 24/32* (2013.01); *H01L 24/73* (2013.01); *H01L 2221/68318* (2013.01); *H01L 2221/68345* (2013.01); *H01L 2221/68359* (2013.01); *H01L 2223/6677* (2013.01); *H01L 2224/16227* (2013.01); *H01L 2224/32245* (2013.01); *H01L 2224/73253* (2013.01)

(58) Field of Classification Search
CPC combination set(s) only.
See application file for complete search history.

(56) References Cited

U.S. PATENT DOCUMENTS

2018/0247905 A1*    8/2018    Yu ..................... H01L 23/3128

* cited by examiner

*Primary Examiner* — Moin M Rahman
(74) *Attorney, Agent, or Firm* — Alston & Bird LLP

(57) ABSTRACT

A method for preparing fan-out antenna packaging structure, includes: providing a carrier and a release layer structure; forming a single-layer antenna structure and a redistribution layer on an upper surface of the release layer; disposing a semiconductor chip electrically connected with the redistribution layer; forming a leading-out conducting wire on the redistribution layer at least on one side of the semiconductor chip; forming a plastic packaging layer wrapping the chip and the leading-out conducting wire; removing part of the plastic packaging layer to expose the chip and the leading-out conducting wire; forming an under-bump metal layer and a solder ball bump on an upper surface of the plastic packaging layer; removing the carrier and the release layer to expose the single-layer antenna structure; soldering a substrate on the solder ball bump; and forming a layer of cooling fins on a second surface of the semiconductor chip.

6 Claims, 5 Drawing Sheets

(51) Int. Cl.
*H01Q 1/22* (2006.01)
*H01Q 1/02* (2006.01)
*H01L 21/683* (2006.01)

FAN-OUT ANTENNA PACKAGING STRUCTURE AND PREPARATION THEREOF

CROSS REFERENCES TO RELATED APPLICATIONS

This application claims the benefit of priority to Chinese Patent Application No. CN201711259488X, entitled "Fan-Out Antenna Packaging Structure and Preparation Method thereof", filed with SIPO on Dec. 4, 2017, and Chinese Patent Application No. CN2017216622032, entitled "Fan-Out Antenna Packaging Structure", filed with SIPO on Dec. 4, 2017, the contents of which are incorporated herein by reference in its entirety.

TECHNICAL FIELD

The present disclosure relates to the technical field of semiconductor packaging, and in particular, to a fan-out antenna packaging structure and preparation method thereof.

BACKGROUND

Circuits of lower-cost, more reliable, faster and higher-density are the goal pursued by integrated circuit packaging. In the future, integrated circuit packaging will increase the integration density of various electronic components by continuously reducing the minimum feature size. At present, advanced packaging methods include Wafer Level Chip Scale Packaging (WLCSP), Fan-Out Wafer Level Packaging (FOWLP), Flip Chip (Flip Chip), Package on Package (POP), and so on.

Fan-out wafer level packaging is an embedded chip packaging method based on wafer level processing, and it is one of the advanced packaging methods with more input/output (I/O) ports and better integration flexibility. Fan-out wafer level packaging has the following unique advantages over conventional wafer level packaging: 1) I/O spacing is flexible and it is independent of chip size; 2) only effective dies are used and the product yield can be improved; 3) the 3D packaging path is flexible and patterns in any array can be formed at the top; 4) the electrical and thermal performance is better; 5) it can be applied in high frequency; and 6) it is easy to achieve high-density wiring in a redistribution layer (RDL).

At present, a fan-out wafer level packaging method of radio frequency chips generally comprises the following steps: providing a carrier and forming an adhesive layer on a surface of the carrier; obtaining a redistribution layer (RDL) on the adhesive layer by performing photo-etching and electroplating; mounting the radio frequency chip on the redistribution layer by adopting a chip bonding process; packaging the chip in a plastic packaging material layer by adopting an injection molding process; removing the carrier and the adhesive layer; forming an Under-Bump Metal (UBM) layer on the redistribution layer by performing photo-etching and electroplating ; performing ball placement and reflow on the UBM layer to form a solder ball bump; and then performing wafer bonding and dicing. For the sake of communication effect, antennas will be provided when the radio frequency chip is used, and for the existing radio frequency chip, antennas are directly laid out on a PCB or interfaces for connecting external antennas are provided by developers when layout design is performed for radio frequency function modules. However, due to the inconvenience in connecting to the external antennas, most of the existing antennas are laid out directly on the PCB, in order to ensure the antenna gain, the size of the antennas must be large enough, and this will inevitably be at the expense of the PCB size.

In view of this, it is necessary to design a new fan-out antenna packaging structure and a preparation method thereof to solve the problems that, when the existing semiconductor chip is externally connected with an antenna, it will increase the PCB size.

SUMMARY

The present disclosure provides a method for preparing a fan-out antenna packaging structure. The method comprises:

step 1) providing a carrier and forming a release layer on an upper surface of the carrier;

step 2) forming a single-layer antenna structure on an upper surface of the release layer and forming a redistribution layer on an upper surface of the single-layer antenna structure;

step 3) disposing one semiconductor chip on an upper surface of the redistribution layer, wherein the semiconductor chip comprises a first surface and a second surface opposite to the first, wherein the first surface of the semiconductor chip sits on and electrically connected with the redistribution layer;

step 4) forming at least one leading-out conducting wire on the redistribution layer next to one side of the semiconductor chip, wherein the leading-out conducting wire is electrically connected with the redistribution layer;

step 5) forming a plastic packaging layer on the upper surface of the redistribution layer, wherein the plastic packaging layer wraps the semiconductor chip and the leading-out conducting wire;

step 6) removing part of the plastic packaging layer to expose the second surface of the semiconductor chip and the leading-out conducting wire;

step 7) forming an under-bump metal layer on an upper surface of the plastic packaging layer, and forming a solder ball bump on an upper surface of the under-bump metal layer, wherein the under-bump metal layer is electrically connected with the leading-out conducting wire;

step 8) removing the carrier and the release layer to expose the single-layer antenna structure;

step 9) soldering a substrate on a surface of the solder ball bump, wherein the substrate is electrically connected with the solder ball bump; and step 10) forming a layer of cooling fins on the second surface of the semiconductor chip.

Preferably, a method for forming the single-layer antenna structure and the redistribution layer comprises:

step 2.1) forming a first dielectric layer on the upper surface of the release layer and performing patterning to the first dielectric layer to form an opening;

step 2.2) forming a first metal wire layer in the opening to form the single-layer antenna structure; and step 2.3) forming at least one stack structure consisting of a second dielectric layer and a second metal wire layer on the upper surface of the single-layer antenna structure to form the redistribution layer.

Preferably, step 3) further comprises a step of forming a connecting solder ball on the upper surface of the redistribution layer, wherein the first surface of the semiconductor chip is electrically connected with the redistribution layer through the connecting solder ball.

Preferably, the leading-out conducting wire in step 4) is formed by adopting a wire bonding process.

Preferably, a method for soldering a substrate on a surface of the solder ball bump in step 9) comprises:

step 9.1) providing a substrate, wherein the substrate comprises a substrate body and a contact pad provided on the substrate body, the substrate body is provided with a via which runs through the substrate body to expose the semiconductor chip; and step 9.2) soldering the solder ball bump on the contact pad to realize electric connection between the solder ball bump and the substrate.

Preferably, step 10) further comprises a step of forming an adhesive layer between the second surface of the semiconductor chip and the layer of cooling fins.

The present disclosure further provides a fan-out antenna packaging structure. The fan-out antenna packaging structure comprises:

a single-layer antenna structure;

a redistribution layer formed on a bottom surface of the single-layer antenna structure;

one semiconductor chip formed on a bottom surface of the redistribution layer, wherein the semiconductor chip comprises a first surface and a second surface opposite to the first surface, wherein the first surface of the semiconductor chip sits on and is electrically connected with the redistribution layer;

a leading-out conducting wire formed on and electrically connected to the bottom surface of the redistribution layer at least on one side of the semiconductor chip;

a plastic packaging layer formed on the bottom surface of the redistribution layer and wrapping around the semiconductor chip and the leading-out conducting wire;

an under-bump metal layer formed on a bottom surface of the plastic packaging layer and electrically connected with the leading-out conducting wire;

a solder ball bump formed on a bottom surface of the under-bump metal layer;

a substrate formed on a lower surface of the solder ball bump and electrically connected with the solder ball bump; and a layer of cooling fins formed on the second surface of the semiconductor chip.

Preferably, the single-layer antenna structure comprises a first dielectric layer with an opening and a first metal wire layer formed in the opening; and the redistribution layer comprises one stack structure consisting of a second dielectric layer and a second metal wire layer.

Preferably, the fan-out antenna packaging structure further comprises a connecting solder ball formed between the redistribution layer and the first surface of the semiconductor chip.

Preferably, the substrate comprises a substrate body and a contact pad provided on the substrate body, wherein the substrate body is provided with a via which runs through the substrate body to expose the semiconductor chip.

Preferably, the fan-out antenna packaging structure further comprises an adhesive layer formed between the second surface of the semiconductor chip and the layer of cooling fins.

DESCRIPTION OF COMPONENT REFERENCE SIGNS

Figure 1:
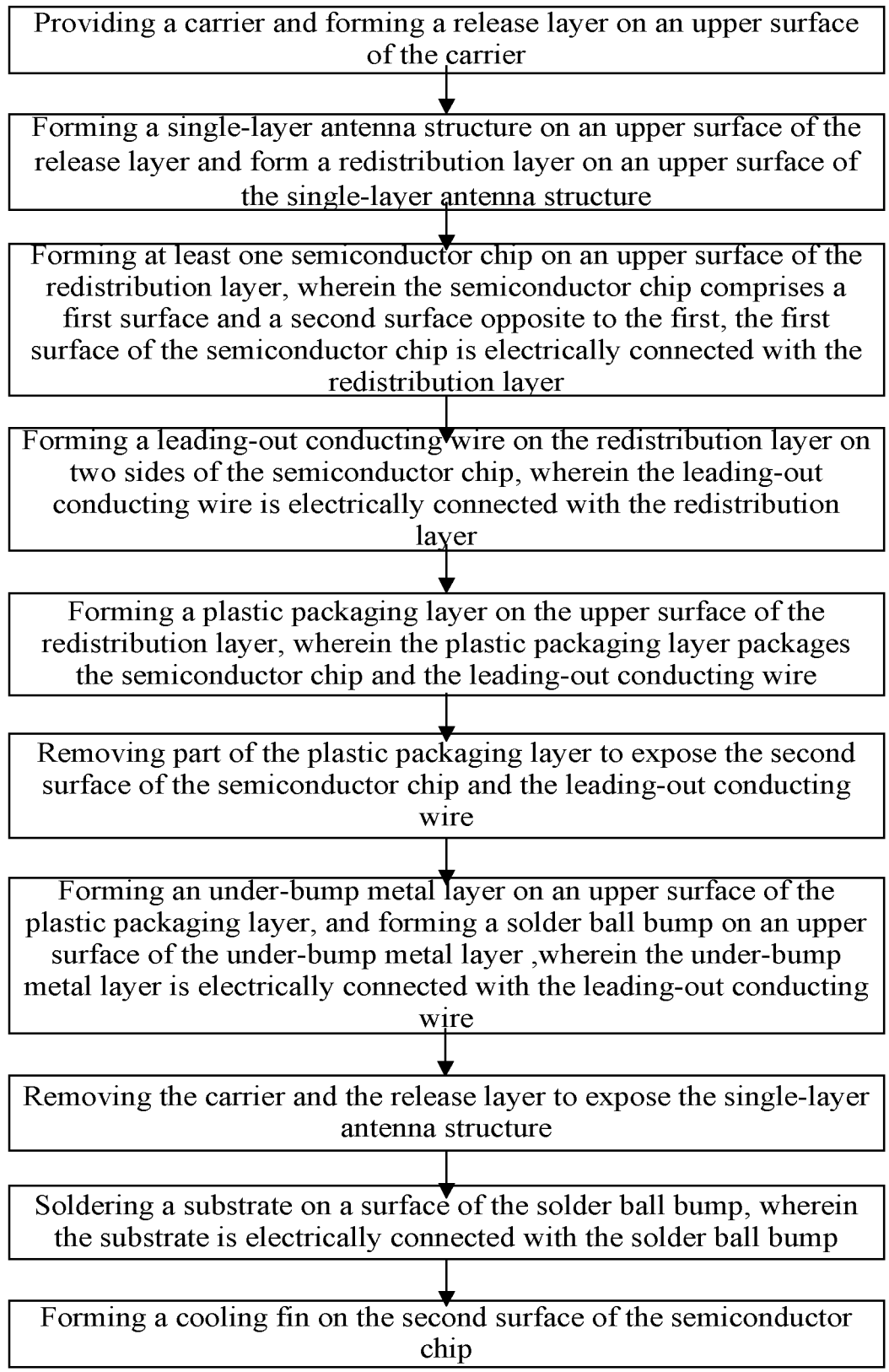
FIG. 1 illustrates a flowchart of a method for preparing a fan-out antenna packaging structure according to an embodiment of the present disclosure.

100 Fan-out antenna packaging structure
101 Carrier
102 Release layer
103 Antenna structure
1031 First dielectric layer
1032 Opening
1033 First metal wire layer
104 Redistribution layer
1041 Second dielectric layer
1042 Second metal wire layer
105 Connecting solder ball
106 Semiconductor chip
107 Leading-out conducting wire
108 Plastic packaging layer
109 Under-bump metal layer
1091 Third dielectric layer
1092 Third metal wire layer
110 Solder ball bump
1101 Metal pole
1102 Solder ball
111 Substrate
1111 Substrate body
1112 Contact pad
112 Adhesive layer
113 Cooling fins

DETAILED DESCRIPTION OF THE PREFERRED EMBODIMENTS

The implementation modes of the present disclosure will be described below through specific embodiments. One skilled in the art can easily understand other advantages and effects of the present disclosure according to content disclosed in the description.

Referring to FIG. 1 to FIG. 14. It shall be noted that the structures, scales, sizes and the like illustrated in the drawings of the description are only used for cooperating with the contents disclosed in the description to allow one skilled in the art to understand and read instead of limiting the implementable limitation conditions of the present disclosure, and thus have no technical substantive meanings; and any structural modifications, changes of scaling relations or adjustments to sizes shall still fall into the scope which can be covered by the technical contents disclosed by the present disclosure under the situation that the effects which can be produced by the present disclosure and the purposes which can be achieved by the present disclosure are not influenced. In addition, words such as "above", "below", "left", "right", "middle" and "one" cited in the description are just used for facilitating clear description instead of limiting the implementable scope of the present disclosure. Changes or adjustments of relative relations thereof shall also be deemed as the implementable scope of the present disclosure under the situation that the technical contents are not substantively changed.

EMBODIMENT 1

As illustrated in FIG. 1, this embodiment provides a method for preparing a fan-out antenna packaging structure. The method comprises:

step 1) providing a carrier 101 and forming a release layer 102 on an upper surface of the carrier 101;

step 2) forming a single-layer antenna structure 103 on an upper surface of the release layer 102 and forming a redistribution layer 104 on an upper surface of the single-layer antenna structure 103;

step 3) forming at least one semiconductor chip 106 on an upper surface of the redistribution layer 104, wherein the semiconductor chip 106 comprises a first surface and an opposite second surface, the first surface of the semiconductor chip 106 is electrically connected with the redistribution layer 104;

step 4) forming a leading-out conducting wire 107 on the redistribution layer 104 on two sides of the semiconductor chip 106, wherein the leading-out conducting wire 107 is electrically connected with the redistribution layer 104;

step 5) forming a plastic packaging layer 108 on the upper surface of the redistribution layer 104, wherein the plastic packaging layer 108 packages the semiconductor chip 106 and the leading-out conducting wire 107;

step 6) removing part of the plastic packaging layer 108 to expose the second surface of the semiconductor chip 106 and the leading-out conducting wire 107;

step 7) forming an under-bump metal layer 109 on an upper surface of the plastic packaging layer 108, and forming a solder ball bump 110 on an upper surface of the under-bump metal layer 109, wherein the under-bump metal layer 109 is electrically connected with the leading-out conducting wire 107;

step 8) removing the carrier 101 and the release layer 102 to expose the single-layer antenna structure 103;

step 9) soldering a substrate 111 on a surface of the solder ball bump 110, wherein the substrate 111 is electrically connected with the solder ball bump 110; and step 10) forming a layer of cooling fins 113 on the second surface of the semiconductor chip 106.

Referring to FIG. 2 to 13. The method for preparing the fan-out antenna packaging structure is illustrated in the cross sectional views of the structure.

Figure 2:
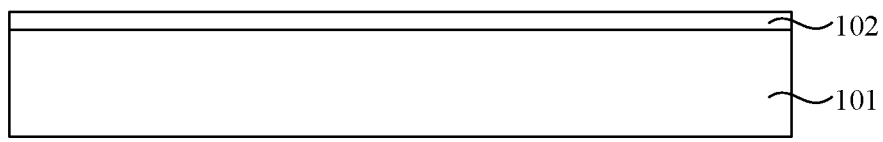
FIG. 2 to FIG. 14 illustrate structural cross sectional views in each step of preparing a fan-out antenna packaging structure according to the embodiment of FIG. 1.

As illustrated in FIG. 2, a carrier 101 is provided and a release layer 102 is formed on an upper surface of the carrier 101.

As an example, a material of the carrier 101 includes but not limited to one of silicon, glass, silicon oxide, ceramics, polymer and metal, or a combination thereof. The carrier 101 is built on a wafer, a blank, or other substrate of a desired shape.

As an example, the material of the release layer 102 includes but not limited to one of adhesive tape, adhesive, epoxy, silicone rubber, polyimide (PI), polybenzoxazole (PBO) and benzocyclobutene (BCB), and is formed by UV (ultraviolet) curing or thermal curing.

Figure 3:
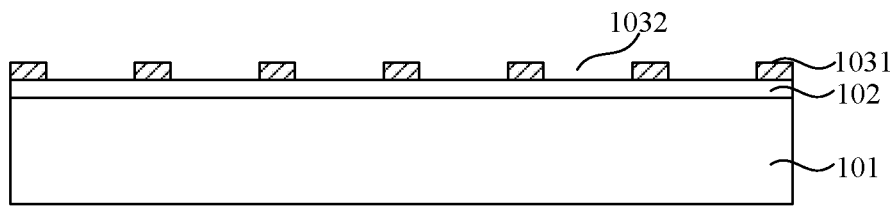
Figure 4:
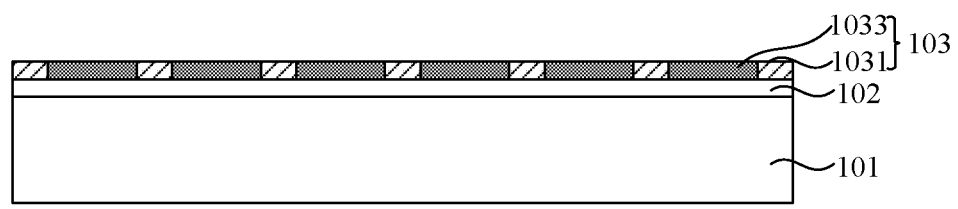
Figure 5:
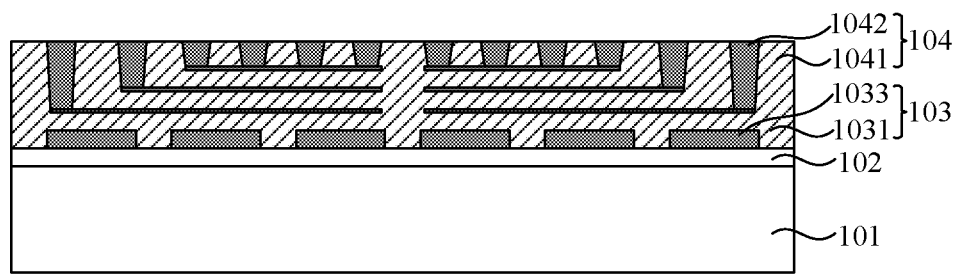

As illustrated in FIG. 3 to FIG. 5, a single-layer antenna structure 103 is formed on an upper surface of the release layer 102 and a redistribution layer 104 is formed on an upper surface of the single-layer antenna structure 103.

As an example, a method for forming the single-layer antenna structure 103 and the rewiring layer 104 comprises:

as illustrated in FIG. 3, forming a first dielectric layer 1031 on the upper surface of the release layer 102, and performing photo-etching to the first dielectric layer 1031 to form an opening 1032;

as illustrated in FIG. 4, forming a first metal wire layer 1033 in the opening 1032 to form the single-layer antenna structure 103; and as illustrated in FIG. 5, forming at least one stack structure consisting of a second dielectric layer 1041 and a second metal wire layer 1042 on the upper surface of the single-layer antenna structure 103 to form the redistribution layer 104.

Specifically, the single-layer antenna structure 103 may be electrically connected with the redistribution layer 104, or maybe not electrically connected with the redistribution layer 104.

It needs to be noted that the single-layer antenna structure is prepared by the same preparation process before preparing the redistribution layer, so as to achieve preparing the single-layer antenna structure and the redistribution layer by the same preparation process, which not only simplifies the process steps of preparing the single-layer antenna structure, but also saves the preparation cost.

Figure 6:
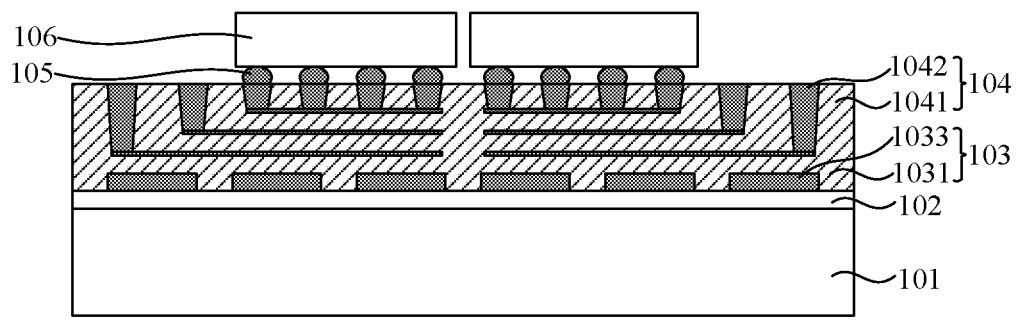

As illustrated in FIG. 6, at least one semiconductor chip 106 is formed on an upper surface of the redistribution layer 104, wherein the semiconductor chip 106 comprises a first surface and an opposite second surface, the first surface of the semiconductor chip 106 is electrically connected with the redistribution layer 104.

As an example, as illustrated in FIG. 6, the step further comprises a step of forming a connecting solder ball 105 on the upper surface of the redistribution layer 104, wherein the first surface of the semiconductor chip 106 is electrically connected with the redistribution layer 104 through the connecting solder ball 105.

Figure 7:
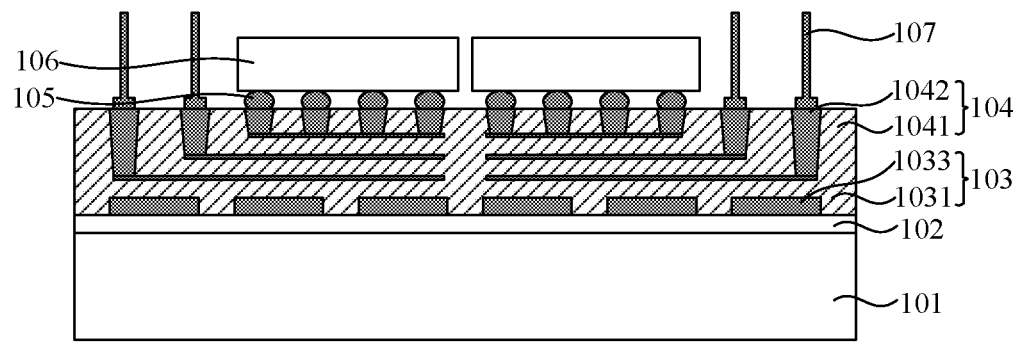

As illustrated in FIG. 7, the leading-out conducting wire 107 is formed on the redistribution layer 104 on two sides of the semiconductor chip 106 by adopting a wire bonding process, wherein the leading-out conducting wire 107 is electrically connected with the redistribution layer 104.

Figure 8:
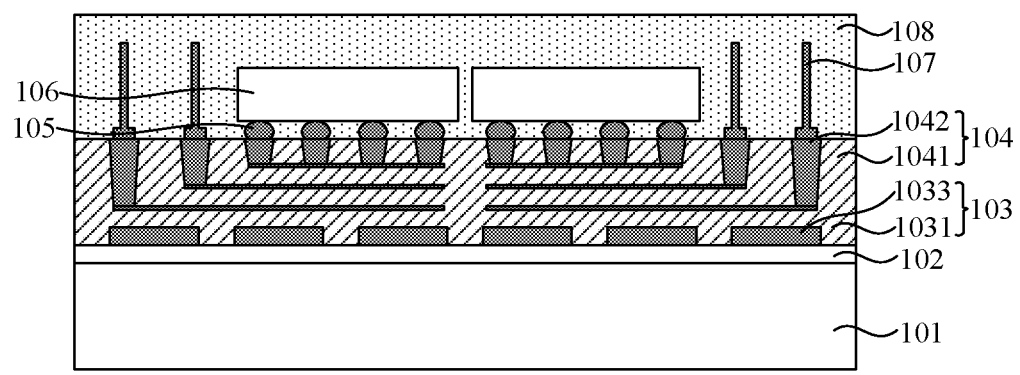

As illustrated in FIG. 8, a plastic packaging layer 108 is formed on the upper surface of the redistribution layer 104, wherein the plastic packaging layer 108 packages the semiconductor chip 106 and the leading-out conducting wire 107.

As an example, the plastic packaging material layer 108 may be formed by adopting a compression molding, transfer molding, liquid seal molding, vacuum laminating or spin coating process, wherein the material of the plastic layer 108 includes, but not limited to, one of polyimide, silica gel and epoxy resin.

Figure 9:
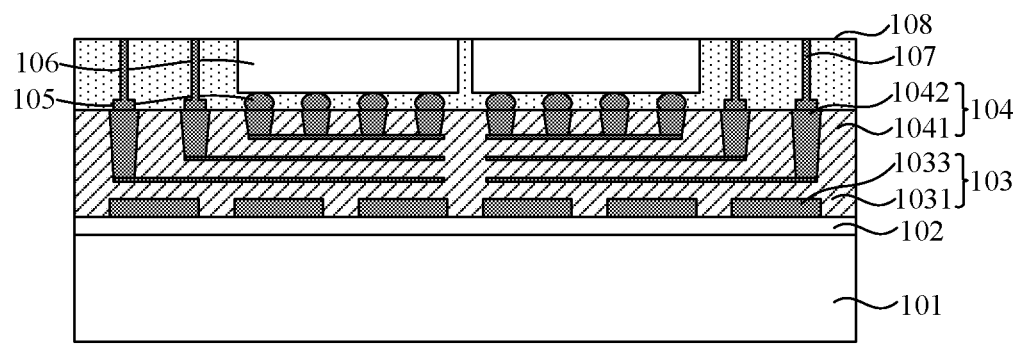

As illustrated in FIG. 9, part of the plastic packaging layer 108 is removed by adopting a grinding process or thinning process to expose the second surface of the semiconductor chip 106 and the leading-out conducting wire 107.

Figure 10:
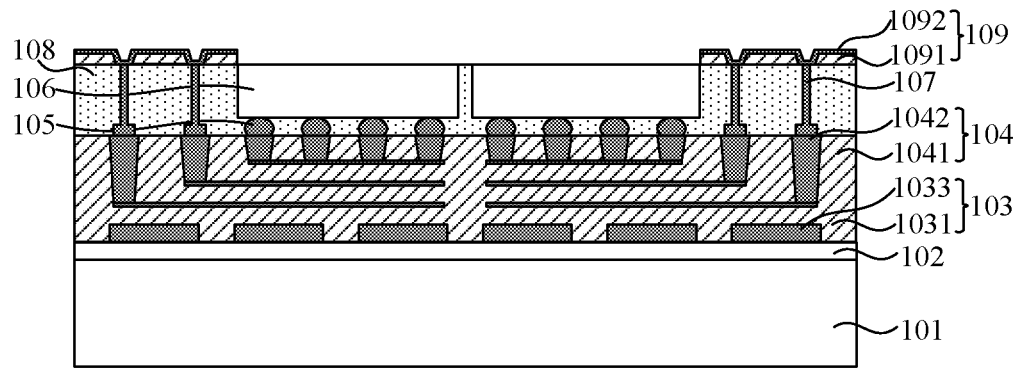
Figure 11:
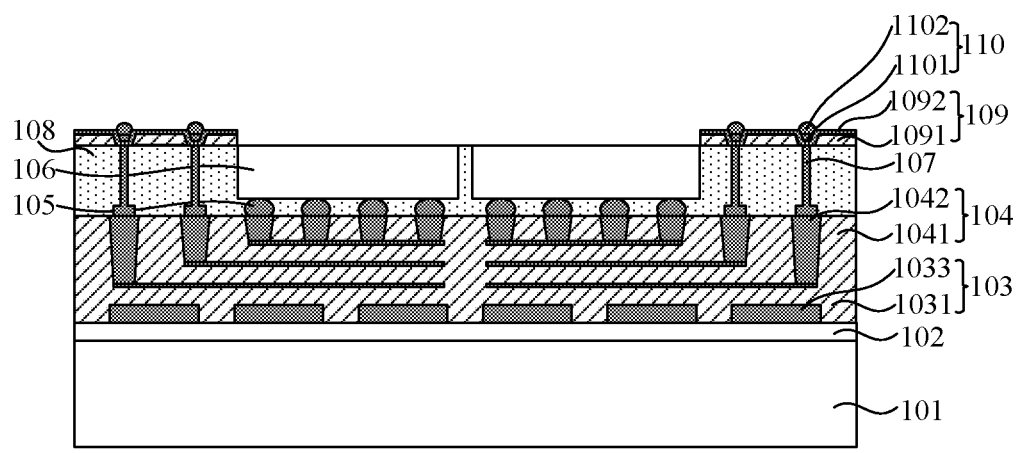

As illustrated in FIG. 10 and FIG. 11, an under-bump metal layer 109 is formed on an upper surface of the plastic packaging layer 108, wherein the under-bump metal layer 109 is electrically connected with the leading-out conducting wire 107, and a solder ball bump 110 is formed on an upper surface of the under-bump metal layer 109.

As an example, as illustrated in FIG. 10, a method for forming the under-bump metal layer 109 comprises: forming a third dielectric layer 1091 on the upper surface of the plastic packaging layer 108; performing photo-etching to the third dielectric layer 1091 to form an opening; then forming a third metal wire layer 1092 in the opening to form an under-bump metal layer.

As an example, as illustrated in FIG. 11, a method for forming the solder ball bump 110 comprises: forming a metal pole 1101 on the upper surface of the under-bump metal layer 109, forming a solder ball 1102 on the upper surface of the metal pole 1101 to form a solder ball bump 110.

Figure 12:
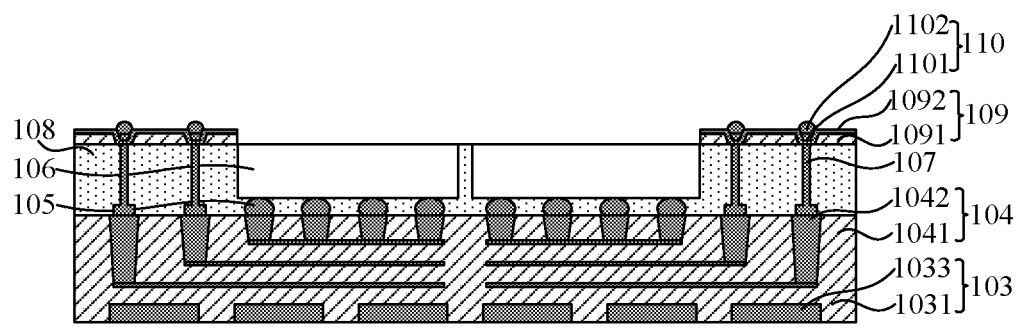

As illustrated in FIG. 12, the carrier 101 and the release layer 102 are removed to expose the single-layer antenna structure 103.

Figure 13:
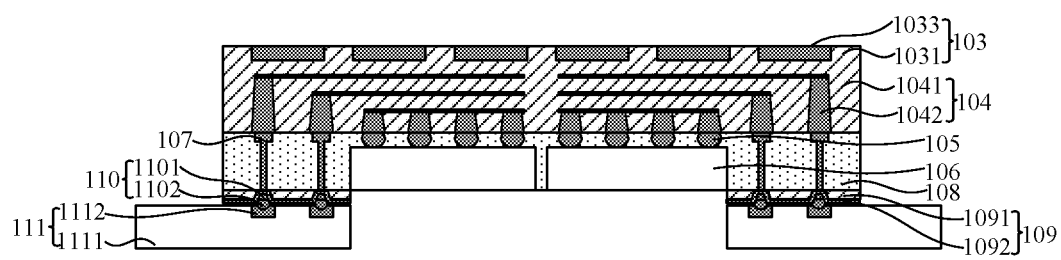

As illustrated in FIG. 13, a substrate 111 is soldered on a surface of the solder ball bump 110, wherein the substrate 111 is electrically connected with the solder ball bump 110.

As an example, a method for soldering a substrate on a surface of the solder ball bump comprises:

as illustrated in FIG. 13, providing a substrate 111, wherein the substrate 111 comprises a substrate body 1111 and a contact pad 1112 provided on the substrate body 1111, the substrate body 1111 is provided with a via which runs through the substrate body 1111 to expose the semiconductor chip 106; and as illustrated in FIG. 13, soldering the solder ball bump 110 on the contact pad 1112 to realize electric connection between the solder ball bump 110 and the substrate 111.

Figure 14:
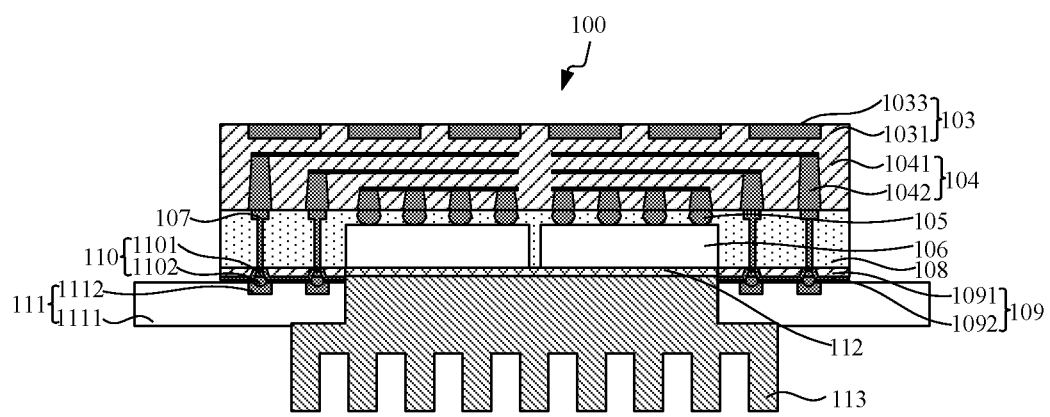

As illustrated in FIG. 14, a layer of cooling fins 113 is formed on the second surface of the semiconductor chip 106.

As an example, as illustrated in FIG. 14, the step further comprises a step of forming an adhesive layer 112 between the second surface of the semiconductor chip 106 and the cooling fins 113.

Specifically, the material of the adhesive layer 112 includes, but not limited to, one of graphene, metal glue and ceramics, which not only has good adhesiveness, but also has good heat dissipation performance

EMBODIMENT 2

As illustrated in FIG. 14, this embodiment provides a fan-out antenna packaging structure. The fan-out antenna packaging structure 100 comprises:

a single-layer antenna structure 103;

a redistribution layer 104 formed on a lower surface of the single-layer antenna structure 103;

at least one semiconductor chip 106 formed on a lower surface of the redistribution layer 104, the semiconductor chip 106 comprising a first surface and an opposite second surface, wherein the first surface of the semiconductor chip 106 is electrically connected with the redistribution layer 104;

a leading-out conducting wire 107 formed on the lower surface of the redistribution layer 104 on two sides of the semiconductor chip 106 and electrically connected with the redistribution layer 104;

a plastic packaging layer 108 formed on the lower surface of the redistribution layer 104 and packaging the semiconductor chip 106 and the leading-out conducting wire 107;

an under-bump metal layer 109 formed on a lower surface of the plastic packaging layer 108 and electrically connected with the leading-out conducting wire 107;

a solder ball bump 110 formed on a lower surface of the under-bump metal layer 109;

a substrate 111 formed on a lower surface of the solder ball bump 110 and electrically connected with the solder ball bump 110; and a layer of cooling fins 113 formed on the second surface of the semiconductor chip 106.

As an example, the antenna structure 103 comprises a first dielectric layer 1031 with an opening 1032 and a first metal wire layer 1033 formed in the opening 1032.

As an example, the redistribution layer 104 comprises at least one stack structure consisting of a second dielectric layer 1041 and a second metal wire layer 1042.

As an example, the fan-out antenna packaging structure 100 further comprises a connecting solder ball 105 formed between the redistribution layer 104 and the first surface of the semiconductor chip 106.

As an example, the under-bump metal layer 109 comprises a third dielectric layer 1091 with an opening and a third metal wire layer 1092 formed in the opening.

As an example, the solder ball bump 110 comprises a metal pole 1101 and a solder ball 1102 formed on a lower surface of the metal pole 1101.

As an example, the substrate 111 comprises a substrate body 1111 and a contact pad 1112 provided on the substrate body 1111, wherein the substrate body 1111 is provided with a via which runs through the substrate body 1111 to expose the semiconductor chip 106.

As an example, the fan-out antenna packaging structure 100 further comprises an adhesive layer 112 formed between the second surface of the semiconductor chip 106 and the cooling fins 113.

Specifically, the material of the adhesive layer 112 includes, but not limited to, one of graphene, metal glue and ceramics, which not only has good adhesiveness, but also has good heat dissipation performance.

To sum up, the fan-out antenna packaging structure and the method for preparing the same provided by the present disclosure have the following beneficial effects: by adopting the same preparation process to form the single-layer antenna structure before forming the redistribution layer, the present disclosure not only can greatly simply the preparation process steps, but also greatly reduce the manufacturing cost. Moreover, through the design of the single-layer antenna structure in the present disclosure, the size of the antenna structure is greatly reduced, the width of antenna structure is reduced, and at the same time, the gain of the antenna structure is greatly improved. By integrally packaging the antenna structure on the semiconductor chip, the integration of the chip packaging structure is improved. Therefore, the present disclosure effectively overcomes various disadvantages in the prior art and thus has a great industrial utilization value.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

What is claimed is:

1. A method for preparing a fan-out antenna packaging structure, comprising:

step 1) providing a carrier and forming a release layer on an upper surface of the carrier;

step 2) forming a single-layer antenna structure on an upper surface of the release layer and forming a redistribution layer on an upper surface of the single-layer antenna structure;

step 3) disposing one semiconductor chip on an upper surface of the redistribution layer, wherein the semiconductor chip comprises a first surface and a second surface opposite to the first, wherein the first surface of the semiconductor chip sits on and is electrically connected with the redistribution layer;

step 4) forming at least one leading-out conducting wire on the redistribution layer next to one side of the semiconductor chip, wherein the leading-out conducting wire is electrically connected with the redistribution layer;

step 5) forming a plastic packaging layer on the upper surface of the redistribution layer, wherein the plastic packaging layer wraps the semiconductor chip and the leading-out conducting wire;

step 6) removing part of the plastic packaging layer to expose the second surface of the semiconductor chip and the leading-out conducting wire;

step 7) forming an under-bump metal layer on an upper surface of the plastic packaging layer, and forming a solder ball bump on an upper surface of the under-bump metal layer, wherein the under-bump metal layer is electrically connected with the leading-out conducting wire;

step 8) removing the carrier and the release layer to expose the single-layer antenna structure;

step 9) soldering a substrate on a surface of the solder ball bump, wherein the substrate is electrically connected with the solder ball bump; and step 10) forming a layer of cooling fins on the second surface of the semiconductor chip.

2. The method for preparing the fan-out antenna packaging structure according to claim 1, characterized in that forming the single-layer antenna structure and the redistribution layer comprises:

step 2.1) forming a first dielectric layer on the upper surface of the release layer and performing patterning to the first dielectric layer to form an opening;

step 2.2) forming a first metal wire layer in the opening to form the single-layer antenna structure; and step 2.3) forming at least one stack structure consisting of a second dielectric layer and a second metal wire layer on the upper surface of the single-layer antenna structure to form the redistribution layer.

3. The method for preparing the fan-out antenna packaging structure according to claim 1, characterized in that step 3) further comprises a step of forming a connecting solder ball on the upper surface of the redistribution layer, wherein the first surface of the semiconductor chip is electrically connected with the redistribution layer through the connecting solder ball.

4. The method for preparing the fan-out antenna packaging structure according to claim 1, characterized in that the leading-out conducting wire in step 4) is formed by adopting a wire bonding process.

5. The method for preparing the fan-out antenna packaging structure according to claim 1, characterized in that a method for soldering a substrate on a surface of the solder ball bump in step 9) comprises:

step 9.1) providing a substrate, wherein the substrate comprises a substrate body and a contact pad provided on the substrate body, the substrate body is provided with a via which runs through the substrate body to expose the semiconductor chip; and step 9.2) soldering the solder ball bump on the contact pad to realize electric connection between the solder ball bump and the substrate.

6. The method for preparing the fan-out antenna packaging structure according to claim 1, characterized in that step 10) further comprises a step of forming an adhesive layer between the second surface of the semiconductor chip and the layer of cooling fins.

\* \* \* \* \*

UNITED STATES PATENT AND TRADEMARK OFFICE
CERTIFICATE OF CORRECTION

PATENT NO. : 10,573,609 B2  
APPLICATION NO. : 16/195706  
DATED : February 25, 2020  
INVENTOR(S) : Yenheng Chen et al.

Page 1 of 1

It is certified that error appears in the above-identified patent and that said Letters Patent is hereby corrected as shown below:

On the Title Page

Item (30), please add:
-- (30) Foreign Application Priority Data
       Dec. 4, 2017 (CN)     2017 1 1259488 X
       Dec. 4, 2017 (CN)     2017 2 1662203 2 --

Signed and Sealed this
Twenty-sixth Day of May, 2020

Andrei Iancu
*Director of the United States Patent and Trademark Office*